United States Patent Office 3,702,765

Patented Nov. 14, 1972

3,702,765

ALKALI-SOLUBLE LIGHT SENSITIVE POLYMERS AND COMPOSITIONS AND PROCESSES FOR USING SUCH POLYMERS

Thomas M. Laakso, Rochester, N.Y., assignor to Eastman Kodak Company, Rochester, N.Y.

No Drawing. Filed Oct. 13, 1970, Ser. No. 80,497
Int. Cl. G03c *1/68, 1/70*
U.S. Cl. 96—33 11 Claims

ABSTRACT OF THE DISCLOSURE

Novel alkali-soluble light sensitive polymers are prepared by a process involving the controlled saponification of a light sensitive polyester which has been prepared by condensation of a polymer containing groups, such as hydroxyl or amino groups, condensible with a light sensitive dicarboxylic acid reactant wherein one of the carboxyl groups has been blocked by conversion to the ester, e.g., with the half ester-half acid chloride of the light sensitive dicarboxylic acid. These alkali-soluble polymers are useful in photosensitive compositions and elements to prepare photomechanical images such as lithographic printing plates, resists, and the like.

This invention relates to photographic reproduction. In a particular aspect it relates to novel light-sensitive polymers and the use of such polymers in the preparation of photographic and photomechanical images.

It is known in the photographic are to reproduce images by processes which involve imagewise exposure of a layer of a radiation-sensitive material to modify the physical characteristics of the material in areas of the layer which have been exposed. Among the radiation-sensitive materials which have been used in such processes are light-sensitive polymers which are insolubilized or hardened on exposure to actinic radiation. The resulting difference in physical properties between exposed and unexposed areas can be employed to prepare images by such procedures as application of mechanical pressure, application of heat, treatment with solvents, and the like. Thus, the layer can be treated with a solvent for the unhardened polymer, which is a non-solvent for the hardened polymer, thereby removing unhardened polymer and leaving an image of hardened polymer. Alternatively, the layer can be heated to a temperature which is between the tackifying point of the material in unexposed areas of the layer and material in exposed areas of the layer so that the lower melting material can be toned with a colored powder or transferred to a receiving surface. Such processes have been employed to prepare lithographic printing plates, stencils, photoresists, and similar photographic and photomechanical images.

The different applications in which light-sensitive polymers are used require that such polymers be available with a variety of photographic and physical characteristics. Thus, there is a continual search for novel light-sensitive polymers. In particular, it would be desirable to obtain light sensitive polymers which are soluble in aqueous solvents, such as aqueous alkaline solutions, and thus with which images can be developed using relatively safe, nontoxic aqueous solutions rather than certain of the organic solvents which typically are used to develop images from such light sensitive polymers.

Accordingly, it is an object of this invention to provide novel light sensitive polymers which are soluble both in organic solvents and aqueous alkaline solutions.

It is another object of this invention to provide novel light sensitive polymers having improved adhesion to substrates on which they are coated.

It is still another object of this invention to provide a process for the preparation of such polymers.

It is a further object of this invention to provide novel photosensitive compositions and elements containing these light sensitive polymers, which can be used to prepare images by development in dilute alkaline solutions.

It is yet a further object of this invention to provide processes for the preparation of photomechanical images using the novel polymers of this invention.

The above and other objects of this invention will become apparent to those skilled in the art from the further description of the invention which follows.

I have discovered that alkali-soluble light sensitive polymers can be prepared from alkali-insoluble light sensitive polymers without destroying the light sensitivity of the polymer by a process involving the careful saponification of terminal ester groups on light-sensitive side chains attached to the alkali-insoluble polymer backbone without cleaving the groups which link the side chain to the polymer backbone. The alkali-insoluble polymer comprises a polymer backbone to which are linked light-sensitive side chains which are the product of condensing a dicarboxylic acid reactant with groups on the polymer backbone condensible therewith. The side chains are terminated with ester groups which were placed on the dicarboxylic acid reactant to block one of the acid groups of the dicarboxylic acid reactant to prevent it from entering into the condensation reaction.

The alkali-insoluble polymers which are useful in the process of the present invention to prepare polymers of the present invention are derived by condensing a light sensitive dicarboxylic acid reactant wherein one of the carboxyl groups has been blocked by conversion to the ester, e.g., the half ester-half acid chloride of the light sensitive dicarboxylic acid, with a polymer which contains groups condensible with the dicarboxylic acid reactant. Typically, the condensible groups on the polymer backbone are hydroxyl group or amino groups and the light sensitive side chain is attached to the polymer backbone through carbonyloxy groups or amido groups.

The alkali-soluble light sensitive polymers of this invention comprise a polymer backbone to which is attached light sensitive side chains having terminal carboxylic acid groups. As indicated above, typically, the side chains are attached to the polymer backbone through carbonyloxy groups or amido groups. Such polymers could not be prepared using prior art procedures, since, if one attempted the condensation of the dicarboxylic acid reactant with the polymer having condensible groups thereon using a dicarboxylic acid reactant which did not have one acid group blocked, a crosslinked polymer would be obtained which would not be light sensitive, and, therefore, which would have little utility in photosensitive compositions.

It is surprising that by employing the procedure of the present invention the terminal ester groups on the side chains of the alkali-insoluble light sensitive polymers can be saponified without adversely affecting the group joining the side chains to the polymer backbone.

The saponification reaction should be carried out under relatively mild conditions so as to prevent cleavage of the linking groups. The temperature of the saponification reaction should not exceed 100° C. and preferably the reaction mixture should be heated only to the temperature which is needed for the reaction to proceed. Temperatures in the range of 35° C. to 70° C. are preferred.

The saponification reaction is carried out by adding alkali to a solution of the alkali-insoluble polymer in a solvent therefor, with heating if required. The concentration of the alkali-insoluble polymer in the organic solvent is not critical and generally will be limited only by the degree of solubility of the polymer in the particular solvent employed. Concentrations of up to 20 percent by weight of the polymer or greater can be effectively utilized. The amount of alkali added during the saponification reaction should not exceed the stoichiometric amount required to saponify the terminal ester groups on the alkali-insoluble polymer. In some instances an alkali-soluble polymer can be obtained using lesser amounts of alkali than the stoichiometric amount required to saponify all of the terminal ester groups. If excess alkali is used, or if the temperature of the saponification reaction exceeds 100° C., it is likely that the groups linking the light sensitive side chain to the polymer of that group will be cleaved, and hence, the light sensitivity of the polymer will be reduced, if not destroyed.

Typically, the alkali is added to the reaction mixture as an aqueous solution of an alkaline material such as sodium hydroxide. During addition of the alkali to the reaction mixture, care should be taken to avoid local build-up of an excess of alkali which would tend to cleave the light sensitive side chain from the polymer backbone. Hence, the reaction mixture should be stirred and alkali should be added at a relatively slow rate.

Typically, the addition of alkali is terminated when an alkali soluble polymer is obtained. This can be determined by dropping a sample of the alkaline reaction mixture into water. If a bulky precipitate is not formed, sufficient terminal ester groups have been converted to carboxylic acid groups to make the polymer water soluble.

Polymers of this invention can be represented by the structural formula:

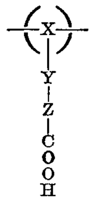

wherein X is a polymer backbone, Y is a carbonyloxy group (—C(=O)—O—)

or an amido group (—C(=O)—NH—)

and Z is a light sensitive moiety. Generally the light sensitive groupings which comprise the light sensitive side chains on the polymers of this invention and the polymers from which they are prepared contain the vinyl ketone group (—CH=CH—C(=O)— and in particular the styryl ketone group

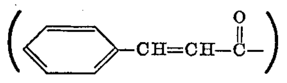

as an integral part of the side chain. Typically, the starting polymers to which the light sensitive side chains are added have molecular weights in the range 4,000 to 300,000 and preferably 15,000 to 150,000. The preferred molecular weight for a given polymer will depend upon the particular type of polymer and its intended use.

Typical of the light sensitive polymers from which the light sensitive polymers of the present invention are prepared are those described in Reynolds et al. U.S. application Ser. No. 3,536 filed Jan. 16, 1970, which have attached to the polymer backbone as the light sensitive moiety, side chains containing two ethylenically unsaturated groups conjugated to each other through an arylene group.

These starting polymers have repeating units which can be represented by the formula

and the polymers of this invention will have repeating units of the formula

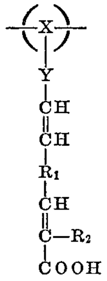

wherein X and Y are as defined above; $R_1$ is an arylene group such as a mono- or polynuclear arylene group e.g., phenylene, naphthylene, biphenylene, chlorophenylene, nitrophenylene, etc., or a 5- or 6-membered heterocyclic group containing such hetero atoms as oxygen, sulfur, nitrogen, etc., pyridylene, furylene, thiofurylene, thienylene, 1-alkyl-2-pyrrolylene, etc., preferably $R_1$ is a phenylene group. $R_2$ and $R_3$ are so selected that they will not react with groups on the polymer backbone to which the light-sensitive moiety is attached. Thus, in the preparation of these polymers using a suitable polymer reactant and a dicarboxylic reactant, one of the carboxylic acid groups on the dicarboxylic acid reactant is blocked so as to prevent crosslinking of the polymer backbone. Thus, $R_2$ is hydrogen, cyano, alkyl generally having 1 to 10 carbon atoms, e.g., methyl, ethyl, propyl, isopropyl, butyl, sec-butyl, t-butyl, n-amyl, neopentyl, n-hexyl, n-heptyl, n-octyl, 2-ethylhexyl, etc., alkenyl generally having 2 to 6 carbon atoms, e.g., vinyl allyl, etc., and the like; and $R_3$ is alkoxycarbonyl generally having 2 to 11 carbon atoms, e.g., methoxycarbonyl, ethoxycarbonyl, propoxycarbonyl, butoxycarbonyl, amyloxycarbonyl, hexyloxycarbonyl, heptyloxycarbonyl, octyloxycarbonyl, nonyloxycarbonyl, etc., alkenyloxycarbonyl generally having 3 to 7 carbon atoms, e.g. allyloxycarbonyl, etc., aryloxycarbonyl e.g., phenoxycarbonyl, and the like, said aryloxycarbonyl being optionally substituted, particularly in the para-position, with such groups as nitro, azido, alkyl generally having 1 to 10 carbon atoms, alkoxy generally having 1 to 10 carbon atoms, dialkylamino, diarylamino and the like group. Such polymers, when saponified in accordance with the present invention will have carboxyvinylcinnamate groups attached to the polymer backbone.

Representative reactants which can be employed to attach the light-sensitive side chain to the polymer include: p-vinylcinnamoyl chlorides such as p-(2-ethoxycarbonylvinyl)cinnamoyl chloride,
p-[2-(2-ethylhexyloxycarbonyl)vinyl]cinnamoyl chloride,
p-(2-hexyloxycarbonylvinyl)cinnamoyl chloride,
p-(2-ethyl-2-ethoxycarbonylvinyl)cinnamoyl chloride,
p-(2-vinyl-2-ethoxycarbonylvinyl)cinnamoyl chloride,
p-(2-allyl-2-propoxycarbonylvinyl)cinnamoyl chloride,
p-(2-ethoxycarbonyl-2-cyanovinyl)cinnamoyl chloride, p-[2-(2-ethylhexyloxycarbonyl)-2-cyanovinyl]cinnamoyl chloride,
p-(2-allyloxycarbonylvinyl)cinnamoyl chloride,
p-(2-vinyl-2-allyloxycarbonylvinyl)cinnamoyl chloride,
p-(2-phenoxycarbonylvinyl)cinnamoyl chloride, etc.;

Other light sensitive polymers which can be used to prepare the light sensitive polymers of the present invention are described in Williams et al. U.S. Ser. No. 850,261 filed Aug. 14, 1969 which describes light sensitive polymers containing recurring cyclohexadiene dicarboxylate units appended to a preformed polymer backbone. Such starting polymers have recurring units which can be represented by structural formula:

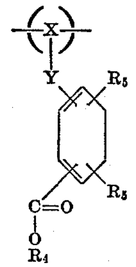

in which case the polymers of this invention will have repeating units of the formula

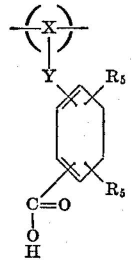

wherein X and Y are as defined above, $R_4$ is a straight or branched chain alkyl group having about 1 to 20 carbon atoms, e.g., methyl ethyl, propyl, isopropyl, butyl, sec-butyl, t-butyl, amyl, neopentyl, hexyl, octyl, ethylhexyl, decyl, dodecyl, etc. and each $R_5$ is an alkyl group of one to 12 carbon atoms including straight and branched chain alkyl groups, e.g., methyl, ethyl, propyl, isopropyl, butyl, t-butyl, amyl, neopentyl, etc., including cycloalkyl groups, as well as alkyl groups substituted with such substituents as would not interfere with the condensation reaction such as halo, nitro, aryl, alkoxy, aryloxy, and the like; or aryl groups including mono and polynuclear, substituted or unsubstituted, aryl groups such as phenyl, naphthyl, chlorophenyl, nitrophenyl, ethoxyphenyl, etc.

Suitable cyclohexadiene dicarboxylate reactants which can be used to prepare these polymers include half esters or half ester-half acid chlorides of such cyclohexadiene dicarboxylic acids as 1,3-cyclohexadiene-1,4-dicarboxylic acid, 1,3-cyclohexadiene-1,3-dicarboxylic acid, 1,3-cyclohexadiene-1,2-dicarboxylic acid, 1,5-cyclohexadiene-1,4-dicarboxylic acid, 1,5-cyclohexadiene-1,3-dicarboxylic acid, 2,4-cyclohexadiene-1,2-dicarboxylic acid, 2,6-cyclohexadiene-1,2-dicarboxylic acid, and alkylated and arylated derivatives of such dicarboxylic acids. The acids in which the carboxylic acid groups are para or meta to each other are preferred. The acids in which the carboxylic acid groups are para to each other are especially preferred.

Still other light sensitive polymers from which the polymers of the present invention can be prepared comprising a backbone having appended thereto a 4-aryl-1-alkoxycarbonyl-1,3-butadienyl group as the light-sensitive moiety. These polymers have repeating units which can be represented by the structure:

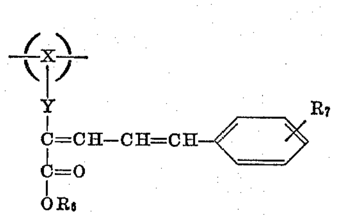

in which case the polymers of this invention will have repeating units of the formula

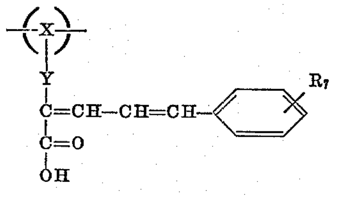

wherein X and Y are as defined above, $R_6$ is a lower alkyl group having 1 to 6 carbon atoms, preferably methyl, and $R_7$ is an inert substituent which will not interfere with the condensation reaction for example, a halogen atom, an alkyl group, a nitro group, an alkoxy group, and the like. These polymers are obtained from the half ester-half acid chloride of a dialkyl cinnamylidenemalonate.

Typical polymers which provide the backbone of these light-sensitive polymers and to which the light sensitive moieties are appended include natural and synthetic resins such as hydroxyl containing polymers, for example, poly(vinyl alcohol), partially hydrolyzed poly(vinyl esters) such as poly(vinyl alcohol-co-vinyl acetate), poly(vinyl alcohol-co-vinyl benzoate), poly(vinyl alcohol-co-vinyl acetate-co-vinyl benzoate), partially hydrolyzed poly(vinyl acetals) such as partially hydrolyzed poly(vinyl butyral), partially hydrolyzed poly(vinyl benzal), partially hydrolyzed poly(vinyl cinnamal) as well as mixtures of such partially hydrolyzed acetals, polyethers such as epoxy polymers, e.g., the condensation product of a bisphenol, such as diphenylolpropane, with epichlorohydrin, naturally occurring materials such as cellulose, starch, guar, alginic acid, and their partially esterified or etherified derivatives, e.g., ethyl cellulose, hydroxyethyl cellulose, hydroxypropyl cellulose, polyesters of polyhydroxy intermediates such as glycerol and sorbitol which have hydroxyl groups remaining after incorporation in the polymer chain, etc.; polymers containing reactive amino groups, for example, poly(vnyl amines), aminostyrenes, poly(vinyl anthranilates), etc.

Light-sensitive polymers from which the polymers of this invention are formed can be prepared by reaction of the hydroxy or amino group on the polymer backbone with an acid halide of the light-sensitive moiety. This reaction is typically carried out in a tertiary amine solvent such as pyridine, picoline, lutidine, triethylamine, and the like, at room temperature, or at elevated temperatures up to about 100° C.

When the hydroxyl containing polymer employed is a poly(vinyl alcohol), light-sensitive polymers which have good solubility and other desirable physical properties can be prepared by the procedure described in copending Reynolds U.S. patent application Ser. No. 812,380 entitled "A Process for the Preparation of Soluble Polyvinyl Esters," filed Apr. 1, 1969. This procedure involves swelling the polyvinyl alcohol in a tertiary amine solvent followed by partial esterification with an aroyl chloride such as benzoyl chloride. The partially aroylated poly(vinyl alcohol) is then esterified with the photosensitive acid chloride, after which any remaining hydroxyl groups optionally can be esterified with aroyl chloride.

In addition to the groups containing the light-sensitive moiety the polymers can have attached to the polymer backbone groups derived from other carboxylic acids. Such other groups are often used in modifying such physical properties of the polymer as solubility, adhesivity, melting point, ink receptivity, resistance to chemical etchants, and the like, and in some instances can modify the sensitometric properties of the polymer as well. Useful groups include those derived from aliphatic and aromatic carboxylic acids, such as acetic acid, haloacetic acid, propionic acid, butyric acid, isovaleric acid, succinic acid, glutaric acid, adipic acid, sebacic acid, 2-ethyl hexanoic acid, decanoic acid, benzoic acid, halobenzoic acids, nitrobenzoic acids, toluic acids, p-ethylbenzoic acid, p-acylbenzoic acid, p-methoxybenzoic acid, p-ethoxybenzoic acid, p-amyloxybenzoic acid, p-lauryloxybenzoic acid, 2-naphthoic acid, and the like, as well as those derived from carboxylic acids which themselves give light-sensitive polymers, for example, acids containing the vinyl ketone group such as cinnamic acid, halocinnamic acids, cinnamylidene acetic acid, and the like. These modifying side chains can be introduced into the polymer by reacting it with an acyl halide of the modifying group, and it can be attached to the polymer prior to addition of the light-sensitive group, for example, when an acetylated poly(vinyl alcohol) is used as the polymer backbone, or when the procedure of the Reynolds' application referred to above, is employed to prepare the light-sensitive polymers of this invention. Alternatively, free reactive groups, which are contained on the polymer backbone after addition of the light-sensitive moiety, can be reacted with an acyl halide, or other suitable reactant, of these modifying groups. The modifying side chains can comprise up to 95% of the groups attached to the polymer backbone. Thus as few as 5% of the groups attached to the polymer backbone can be light-sensitive groups. In general, it is preferred that 5 to 50% of the groups attached to the polymer backbone are light-sensitive groups, although this will vary depending upon the nature of the polymer forming the backbone, its molecular weight, and similar factors. Thus, for example, when a low molecular weight poly(vinyl alcohol) is employed as the polymer backbone preferably 20 to 100 mole percent of the groups attached to the polymer backbone are light sensitive groups; when a medium molecular weight poly(vinyl alcohol) is employed 10 to 60 mole percent of the groups attached to the polymer backbone are preferably light-sensitive groups; and with a high molecular weight poly(vinyl alcohol) it is preferred that 5 to 50 mole percent of the groups attached to the polymer backbone be light-sensitive groups.

Coating compositions containing the light-sensitive polymers of this invention can be prepared by dispersing or dissolving the polymers in any suitable solvent or combination of solvents used in the art to prepare polymer dopes. Aqueous alkaline solutions can be used. Other solvents that can be used to advantage include ketones such as 2-butanone, 4-methyl-2-pentanone, cyclohexanone, 4-butyrolactone, 2,4-pentandione, 2,5-hexandione, etc.; esters such as 2-ethoxyethyl acetate, 2-methoxyethyl acetate, n-butyl acetate, etc.; chlorinated solvents such as chloroform dichloroethane, trichloroethane, tetrachloroethane, etc.; as well as dimethylformamide and dimethyl sulfoxide: and mixtures of these solvents. Typically the light-sensitive polymer is employed in the coating composition in the range from about 1 to 20 percent by weight. Preferably the polymer comprises 2 to 10 percent by weight of the composition in a solvent such as listed above. The coating compositions also can include a variety of photographic addenda utilized for their known purpose, such as agents to modify the flexibility of the coating, agents to modify its surface characteristics, dyes and pigments to impart color to the coating, agents to modify the adhesivity of the coating to the support, antioxidants, preservatives, and a variety of other addenda known to those skilled in the art.

The coating compositions can be sensitized with such sensitizers as pyrylium and thiapyrylium dye salts, thiazoles, benzothiazolines, naphthothiazolines, quinolizones, acridones, cyanine dyes, dithiolium salts, Michler's ketone, Michler's thioketone, and the like sensitizers. When a sensitizer is employed, it can be present in amounts of about 0.1 to 10 percent by weight of the light-sensitive polymer, and it is preferably employed in the range of about 0.2 to 3 percent by weight of the light-sensitive polymer.

The light-sensitive polymer of this invention can be the sole polymeric constituent of the coating composition or another polymer can be incorporated therein to modify the physical properties of the composition and serve as a diluent. For example, phenolic resins, such as thermoplastic novolac resins or solvent-soluble resole resins can be incorporated in the composition to improve the resistance of the polymer composition to etchants when it is used as a photoresist. Similarly, hydrophilic polymers such as cellulose and its derivatives, poly(alkylene oxides), poly(vinyl alcohol) and its derivatives, and the like can be incorporated in the composition to improve the hydrophilic properties of the coating when it is used in the preparation of lithographic printing plates. These other polymeric materials can constitute up to 25% by weight of the polymeric components of the coating composition.

Photosensitive elements can be prepared by coating the photosensitive compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate, cellulose acetate butyrate, and the like. The optimum coating thickness for a particular purpose will depend upon such factors as the use to which the coating will be put, the particular light-sensitive polymer employed, and the nature of other components which may be present in the coating. Typical coating thicknesses can be from about 0.1 to 10 mils.

Photomechanical images can be prepared with photosensitive elements by imagewise exposing the element to a light source to harden or insolubilize the polymer in exposed areas. Suitable light sources which can be employed in exposing the elements include sources rich in visible radiation and sources rich in ultraviolet radiation, such as carbon arc lamps, mercury vapor lamps, fluorescent lamps, tungsten lamps, photoflood lamps, and the like.

The exposed element can be developed with a solvent for the unexposed, uncrosslinked polymer which is a non-solvent for the exposed hardened polymer. Such solvents include aqueous alkaline solutions such as aqueous solutions of sodium hydroxide as well as certain of the organic solvents listed above as suitable coating solvents as well as others.

In an alternate embodiment an image can be developed with the exposed elements by heating it to a temperature in the range of about 50 to 200° C., which is intermediate between the tackifying point of the polymer in unexposed and exposed areas, to soften or tackify the polymer in the unexposed areas. The softened polymer can then be toned or transferred to a receiving sheet under pressure and toned, or transferred without toning if a pigment, dye or color-forming compound is incorporated in the layer.

The following examples further illustrate this invention.

EXAMPLE 1

An epoxy p-[2-(2-ethylhexyloxycarbonyl)vinyl]cinnamate polymer having the structure

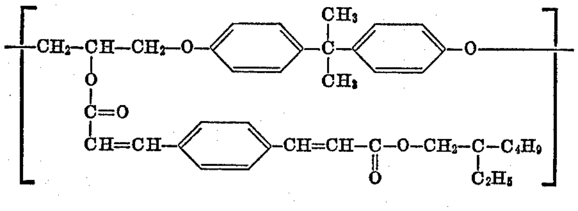

is prepared as described in Example 13 of U.S. patent application Ser. No. 3,536 filed Jan. 16, 1970 by reaction of p- 2-(2-ethylhexyloxycarbonyl)vinyl]cinnamoyl chloride with the polyether condensation product of 2,2-bis(p-hydroxyphenyl)propane and epichlorohydrin, which polymer has an inherent viscosity of 0.87 measured at a concentration of 0.25 gram per deciliter in dioxane at 25° C. Two grams of this polymer are dissolved in dimethyl formamide and treated with a solution containing 1 gram of sodium hydroxide in 10 ml. of water. The alkaline solution is added dropwise with stirring to the polymer solution at a rate slow enough to prevent the polymer from precipitating. During addition, the mixture is gently warmed, keeping the temperature below 65° C. and stirred. The reaction is complete when a small sample dropped into water fails to produce a bulky visible precipitate, indicating the conversion of the terminal ester groups to carboxy groups, although the solution itself is still cloudy at this point due to water insoluble saponification products. To reach this point 1.5 ml. of the sodium hydroxide solution are used. The reaction mixture is then poured into water and extracted once with diethyl ether. The aqueous layer is separated and filtered until the filtrate is clear. Acidification of the filtrate produces a cream colored polymer which is collected by filtration, washed thoroughly with water and dried. The product (about 0.7 g.) is soluble in 1,2-dichloroethane alkaline solutions.

*Analysis.*—Calcd. for $C_{30}H_{28}O_6$ (percent): C, 75.0; H, 5.8. Found (percent): C, 74.9, C, 75.2; H, 7.3, H, 7.4. Average (percent): C, 75.1; H, 7.4.

EXAMPLE 2

The polymer of Example 1 (0.1 gram) is dissolved in 10 ml. of 1,2-dichloroethane, the solution is filtered, whirl-coated on an anodized grained aluminum plate and then dried. The resulting light sensitive element is exposed imagewise to a high pressure mercury lamp to crosslink the polymer in exposed areas and the exposed element is developed by washing with dilute sodium hydroxide followed by a water wash. This plate provides an excellent negative-working lithographic printing plate. Sensitivity values for the above polymer are determined in 1,2-dichloroethane by the procedures described in J. Appl. Pol. Sci. 2, 302, 308–311, 358–362 (1959) and ibid., 3, 310–315 (1960).

| Sensitizer | Sensitivity value | Spectral range (nm). |
|---|---|---|
| None | 500 | 270–330 |
| 2-benzoylmethylene-1-ethyl-β-naphthothiazoline | 2,000 | 270–460 |
| 2,6-bis(p-ethoxyphenyl)-4-(p-n-amyloxyphenyl)thiapyrylium perchlorate | 2,000 | 270–570 |

This invention has been described in detail with particular reference to the preferred embodiments thereof but it will be understood that variations and modifications can be effected within the spirit and scope of the invention.

What is claimed is:

1. A photosensitive element comprising a support bearing a layer of a light-sensitive polymer having repeating units of the formula

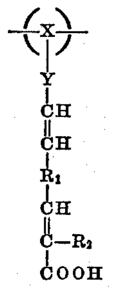

wherein X is a polymer backbone derived from a polymer containing hydroxyl or amino groups, Y is a carbonyloxy group or an amido group, $R_1$ is an arylene group, and $R_2$ is selected from the group consisting of hydrogen, cyano, alkyl of 1 to 10 carbon atoms and alkenyl of 2 to 6 carbon atoms.

2. A process for preparing a photomechanical image which comprises exposing to actinic radiation an element of claim 1 to harden polymer in exposed areas and developing an image by removing polymer from the unexposed areas.

3. A process of claim 2 wherein polymer in unexposed areas is removed by washing the element with an aqueous alkaline solution.

4. A photosensitive element comprising a support bearing a layer of an alkali-soluble, light-sensitive polymer comprising a polymer backbone to which is attached, as light-sensitive side chains, p-carboxyvinyl cinnamate groups.

5. A photosensitive element as defined in claim 4 wherein the light-sensitive polymer is an epoxy p-(carboxyvinylcinnamate).

6. A photosensitive element comprising a support bearing a layer of an alkali-soluble, light-sensitive polymer comprising a polymer backbone derived from a polymer having free hydroxyl groups and attached thereto, through carbonyloxy groups, light-sensitive side chains containing a vinyl ketone group and a terminal carboxylic acid group.

7. A photosensitive element comprising a support bearing a layer of an alkali-soluble, light-sensitive polymer comprising a polymer backbone derived from a polymer having free amino groups and attached thereto, through amido groups, light-sensitive side chains containing a vinyl ketone group and a terminal carboxylic acid group.

8. A photosensitive composition comprising a solution of an alkali-soluble, light-sensitive polymer comprising a polymer backbone derived from a polymer having free hydroxyl groups and attached thereto, through carbonyloxy groups, light-sensitive side chains containing a vinyl ketone group and a terminal carboxylic acid group.

9. A photosensitive composition comprising a solution of an alkali-soluble, light-sensitive polymer comprising a polymer backbone derived from a polymer having free amino groups and attached thereto, through amido groups, light-sensitive side chains containing a vinyl ketone group and a terminal carboxylic acid group.

10. A photosensitive composition comprising a solution of an alkali-soluble, light-sensitive polymer comprising a polymer backbone to which is attached, as light-sensitive side chains, p-carboxyvinyl cinnamate groups.

11. A photosensitive composition comprising a solution of a light-sensitive polymer having repeating units of the formula

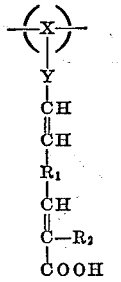

wherein X is a polymer backbone derived from a polymer containing hydroxyl or amino groups, Y is a carbonyloxy group or an amido group, $R_1$ is an arylene group, and $R_2$ is selected from the group consisting of hydrogen, cyano, alkyl of 1 to 10 carbon atoms and alkenyl of 2 to 6 carbon atoms.

References Cited

UNITED STATES PATENTS

| | | | |
|---|---|---|---|
| 3,072,485 | 1/1963 | Reynolds et al. | 96—115 R |
| 2,948,610 | 8/1960 | Merrill et al. | 96—115 R |
| 2,824,084 | 2/1958 | Unruh et al. | 96—115 R |
| 2,861,057 | 11/1958 | Merrill et al. | 96—115 R |
| 2,887,376 | 5/1959 | Tupis | 96—115 R |

RONALD H. SMITH, Primary Examiner

U.S. Cl. X.R.

96—35.1, 115 R; 260—47 EP